United States Patent
Ng et al.

(10) Patent No.: US 6,548,367 B1
(45) Date of Patent: Apr. 15, 2003

(54) METHOD TO FABRICATE MIM CAPACITOR WITH A CURVILLNEAR SURFACE USING DAMASCENE PROCESS

(75) Inventors: Chit Hwei Ng, Singapore (SG); Chaw Sing Ho, Singapore (SG)

(73) Assignee: Chartered Semiconductor Manufacturing Limited, Singapore (SG)

( * ) Notice: Subject to any disclaimer, the term of this patent is extended or adjusted under 35 U.S.C. 154(b) by 0 days.

(21) Appl. No.: 10/120,105

(22) Filed: Apr. 9, 2002

Related U.S. Application Data

(62) Division of application No. 10/012,296, filed on Nov. 12, 2001.

(51) Int. Cl.⁷ .............................................. H01L 21/20
(52) U.S. Cl. .......................... 438/396; 438/381; 438/10; 438/243
(58) Field of Search .................................. 438/396, 243, 438/10, 381, 386; 257/528, 306, 303

(56) References Cited

U.S. PATENT DOCUMENTS 6,417,535 B1 * 7/2002 Johnson et al. ............. 257/306
2002/0067167 A1 * 6/2002 Romo et al. ................ 324/318

* cited by examiner

Primary Examiner—Carl Whitehead, Jr.
Assistant Examiner—Yennhu B. Huynh
(74) Attorney, Agent, or Firm—Wagner, Murabito & Hao LLP

(57) ABSTRACT

In one method embodiment, the present invention recites forming an opening in a substrate during a damascene process. The present embodiment then recites forming a dielectric region having two curvilinear surfaces opposite one another at least partially within the opening during the damascene process. The surfaces are curvilinear with respect to a horizontal cross-section. The present embodiment then recites forming a first copper region having a curvilinear surface proximate one of the surfaces of the dielectric region during the damascene process. The present embodiment then recites forming a second copper region having a curvilinear surface proximate a second surface of the dielectric region during the damascene process. In so doing, the dielectric region forms a dielectric barrier between the first copper region and the second copper region such that the vertical cylindrical MIM capacitor is formed.

7 Claims, 18 Drawing Sheets

METHOD TO FABRICATE MIM CAPACITOR WITH A CURVILLNEAR SURFACE USING DAMASCENE PROCESS

This is a divisional of copending application(s) Ser. No. 10/012,296 filed on Nov. 12, 2001 which designated in the U.S.

FIELD OF THE INVENTION

The present claimed invention relates to the field of semiconductor processing. More particularly, the present claimed invention relates to novel vertical cylindrical and serpentine metal-insulator-metal (MIM) capacitors and a method for forming such capacitors.

BACKGROUND ART

As semiconductor geometries continue to become smaller and smaller, new difficulties arise in the fabrication of semiconductor devices. As one example, with progressively finer design rules, a problem has arisen due to capacitance between adjacent metal layers (i.e. interlayer capacitance). That is, as devices shrink in size, adjacent layers are spaced more closely together. Such a condition results in a deleterious increase in interlayer capacitance which adversely affects operation of finer design rule-based semiconductor devices. A similar problem exists due to the reduced distance between adjacent metal lines. Specifically, under some circumstances, unwanted effects such as cross-talk and various other RC (resistance/capacitance) delay effects between closely spaced metal lines negatively affect the operation of the semiconductor devices.

In one attempt to reduce such deleterious effects, newer semiconductor fabrication techniques are employing lower resistance metals (e.g. copper) to form many metal elements (e.g. lines, interconnects, and the like). Such newer semiconductor fabrication techniques include, for example, damascene and dual-damascene processes which readily employ copper metal and which achieve highly desirable results. Unfortunately, copper, as an example, is not readily etched in the manner which conventionally-used aluminum, for example, is etched. As a result, certain structures, such as capacitors, which in the past have been readily formed, at least in-part, by the etching of aluminum, are not compatible with the newer semiconductor fabrication techniques such as, for example, copper damascene and copper dual-damascene processes.

When forming huge copper plates several problems such as dishing, cusping, and erosion occur. For example, using conventional chemical mechanical polishing (CMP), severe dishing may occur when the copper plates are larger than, for example, 8–10 micrometers. Therefore, large copper metal-insulator-metal (MIM) capacitors plates with a dimension larger than, for example, 10 micrometers by 10 micrometers are difficult to form with copper damascene and copper dual-damascene processes.

As yet another concern, in order to achieve widespread acceptance, and to ensure affordability, any method of forming a capacitor, which overcomes the above-listed drawbacks, should be compatible with existing semiconductor fabrication processes.

Furthermore, the desire for high density semiconductor devices, may be compromised by the presence of passive devices. In particular, high capacitance capacitors consume considerable surface area when manufactured according to many conventional techniques.

Thus, a need exists for a capacitor and a method for forming the capacitor wherein the capacitor and the formation method are compatible with newer semiconductor fabrication techniques. A further need exists for a capacitor and a method for forming the capacitor wherein the capacitor and the formation method meet the above need and are compatible with existing semiconductor fabrication processes such that significant revamping of semiconductor capital equipment is not required. A further need exists for a capacitor and a method for forming the capacitor which provides a high capacitance per unit area.

SUMMARY OF INVENTION

The present invention provides a capacitor and a method for forming the capacitor wherein the capacitor and the formation method are compatible with newer semiconductor fabrication techniques. The present embodiment further provides a capacitor and a method for forming the capacitor wherein the capacitor and the formation method achieve the above-listed accomplishment and are compatible with existing semiconductor fabrication processes such that significant revamping of semiconductor capital equipment is not required. The present embodiment further provides a capacitor and a method for forming a capacitor with huge copper plates, for example, larger than 100 square micrometers. The present embodiment provides for a capacitor and a method for forming a capacitor with a high capacitance per unit area.

In one method embodiment, the present invention recites forming an opening in a substrate during a damascene process. The present embodiment then recites forming a dielectric region having two curvilinear surfaces opposite one another at least partially within the opening during the damascene process. The surfaces are curvilinear with respect to a horizontal cross-section. The present embodiment then recites forming a first copper region having a curvilinear surface proximate one of the surfaces of the dielectric region during the damascene process. The present embodiment then recites forming a second copper region having a curvilinear surface proximate a second surface of the dielectric region during the damascene process. In so doing, the dielectric region forms a dielectric barrier between the first copper region and the second copper region such that the vertical cylindrical MIM capacitor is formed.

Another embodiment performs the above steps in which the curvilinear surfaces are cylindrical. In this fashion, a vertically oriented cylindrical MIM capacitor is formed.

Yet another embodiment performs the above steps in which the curvilinear surfaces are serpentine. In this fashion, a vertical serpentine MIM capacitor is formed.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
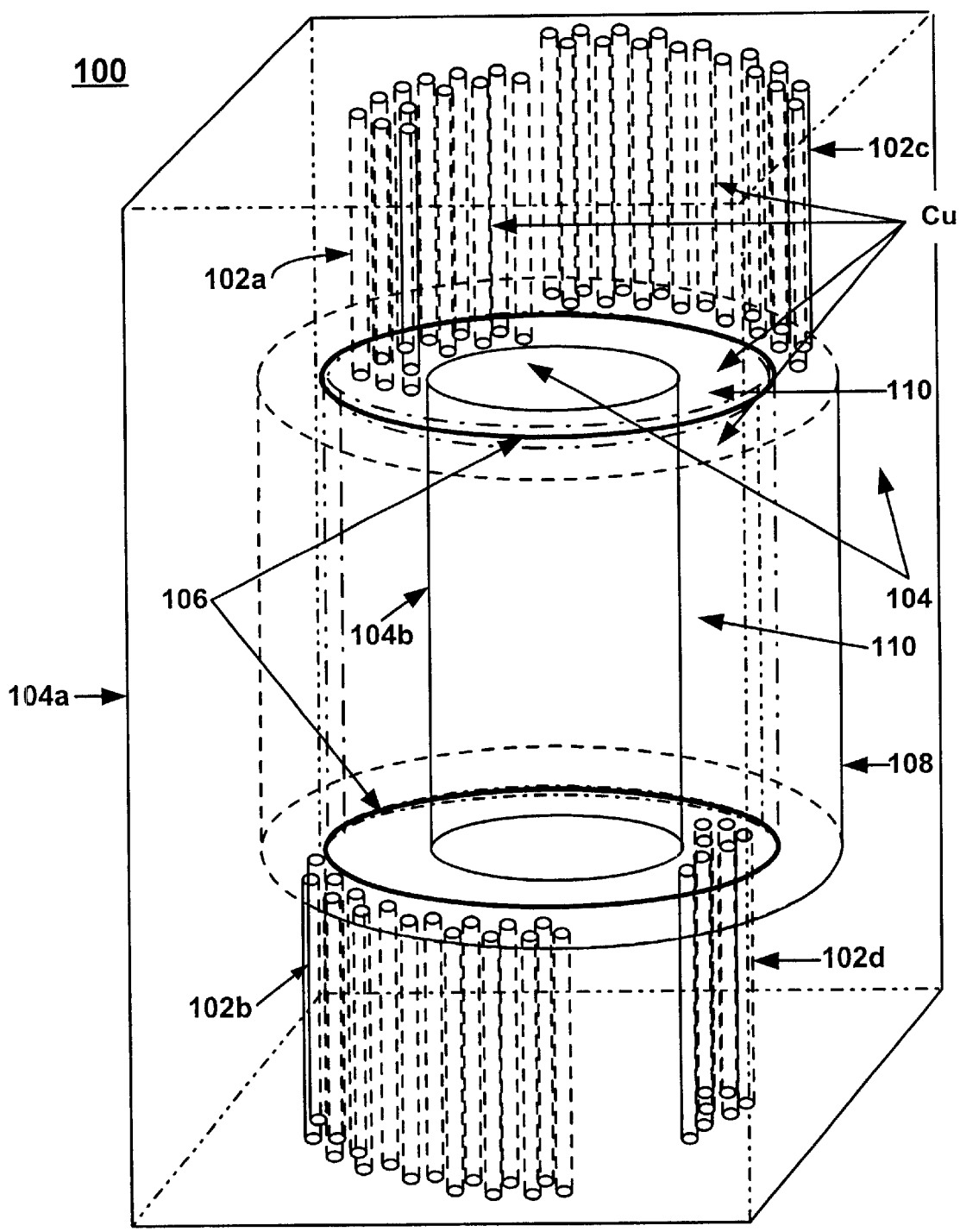
FIG. 1A is a perspective view of a vertical cylindrical metal-insulator-metal capacitor, in accordance with one embodiment of the present claimed invention.
Figure 1B:
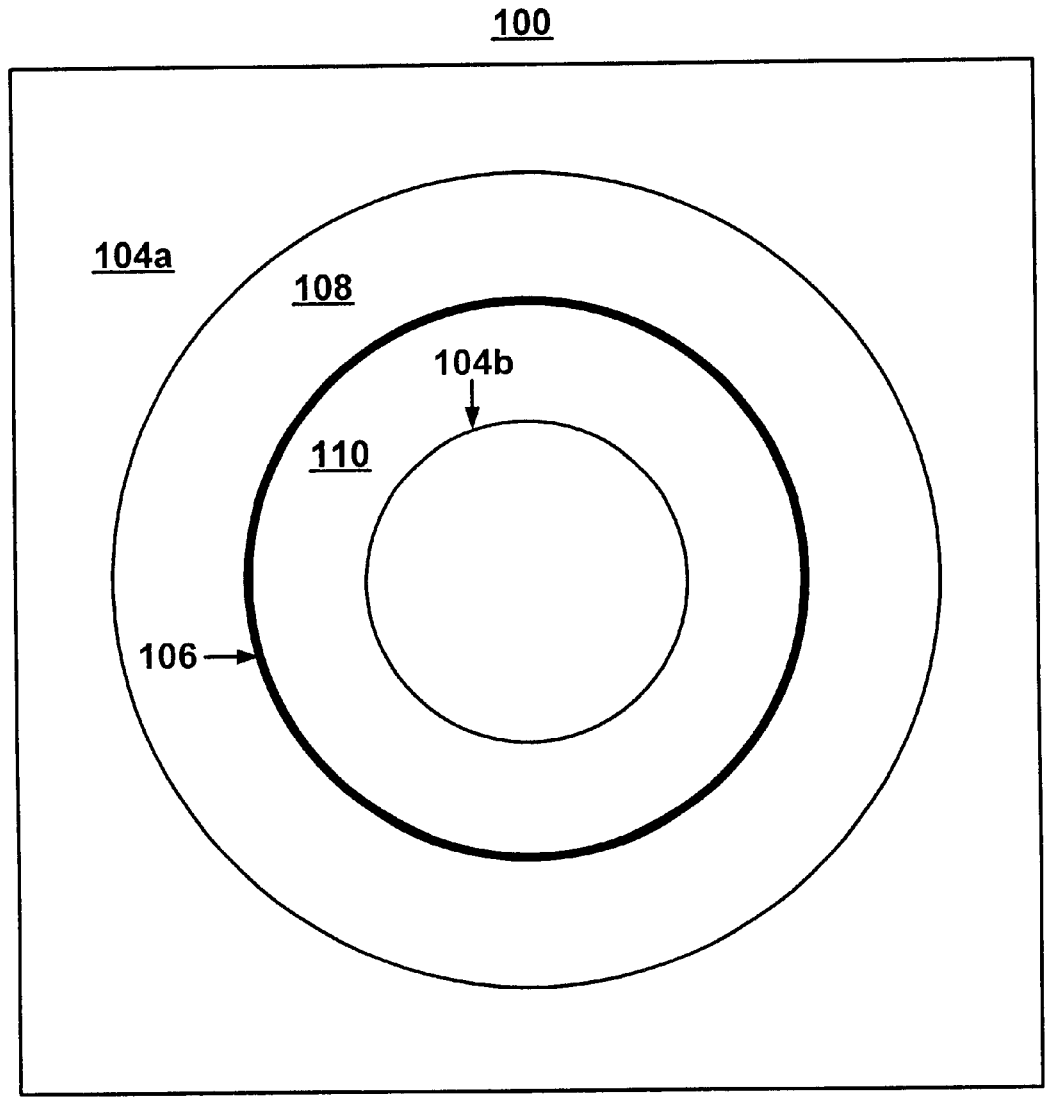
FIG. 1B is a top view of the vertical cylindrical metal-insulator-metal capacitor of FIG. 1A, in accordance with one embodiment of the present claimed invention.

FIG. 1A is a perspective view of a vertical cylindrical metal-insulator-metal capacitor 100 formed in a damascene process, according to an embodiment of the present invention. FIG. 1B shows the same structure from a top view. The vertical cylindrical capacitor 100 comprises an outer metal cylinder 108 having a substantially cylindrical inner surface and an inner metal region 110 having a substantially cylindrical outer surface. Each metal region 108, 110 also has a second surface which is shown to be cylindrical, although this is not required. A high k dielectric material 106 having substantially cylindrical inner and outer surfaces resides between the copper cylinders 108, 110 to form the vertical cylindrical capacitor 100. There is a substrate of inter-metal dielectric 104 (e.g. low k dielectric material), a portion of which is inside the inner metal cylinder 110. A second portion of the substrate of inter-metal dielectric 104 resides outside the vertical cylindrical MIM capacitor 100. Electrodes 102a and 102d connect the inner copper cylinder 110 to higher and lower layers of the circuit, respectively. Electrodes 102c and 102b connect the outer copper cylinder 108 to higher and lower layers of the circuit, respectively.

Figure 4A:
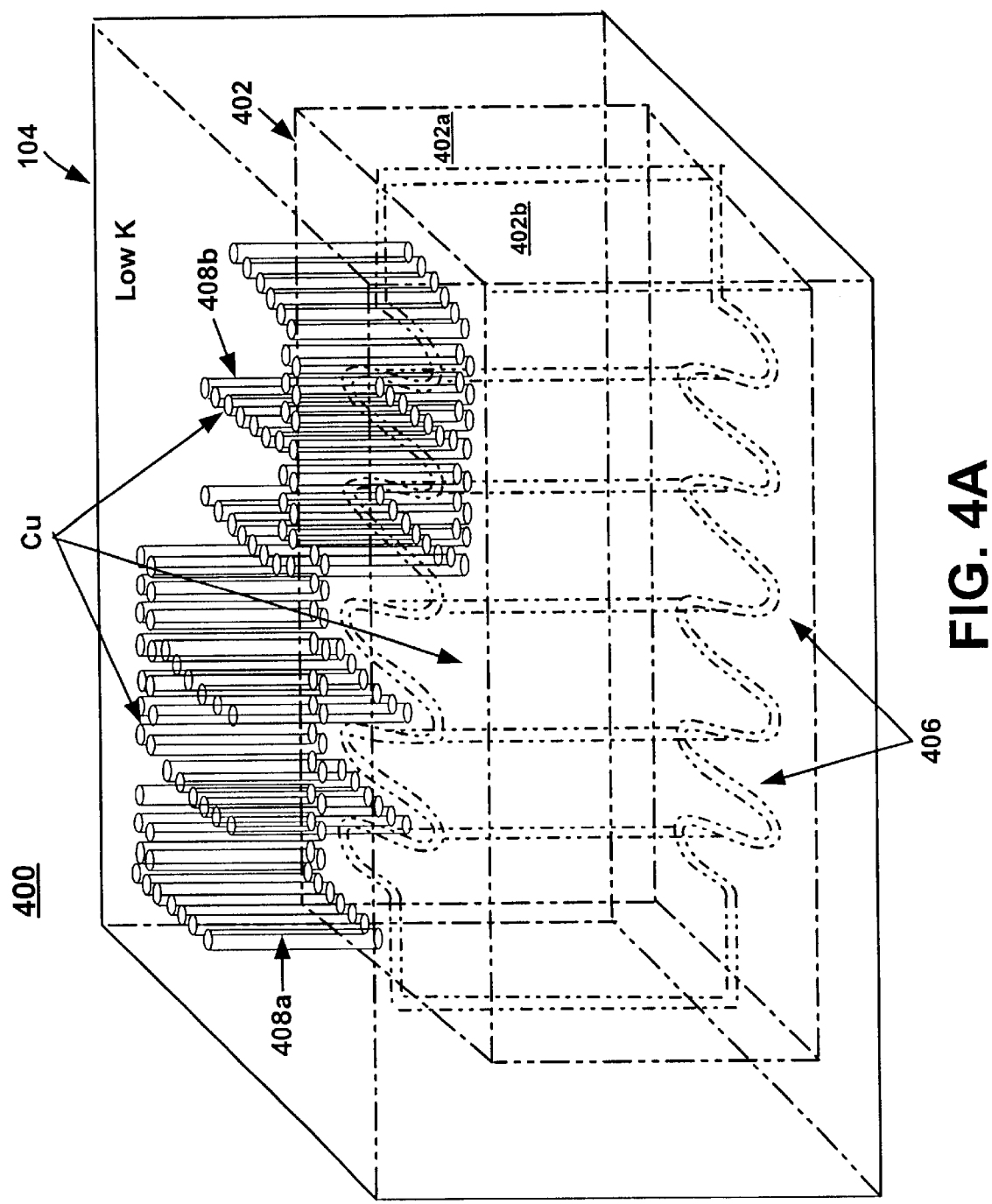
FIG. 4A is a perspective view of a vertical serpentine metal-insulator-metal capacitor, in accordance with one embodiment of the present claimed invention.
Figure 4B:
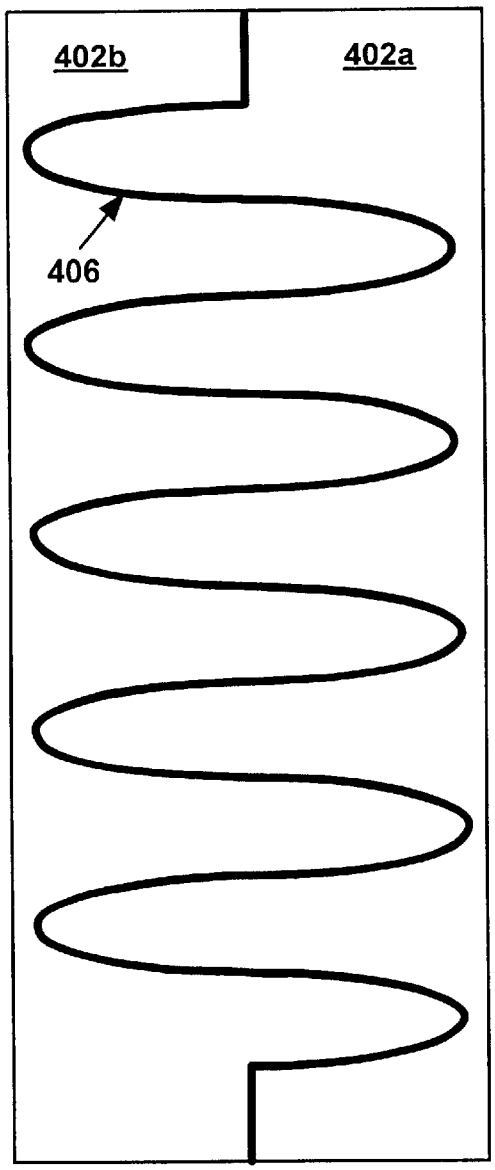
FIG. 4B is a top view of the vertical serpentine metal-insulator-metal capacitor of FIG. 4A, in accordance with one embodiment of the present claimed invention.

FIG. 4A is a perspective view of a vertical serpentine metal-insulator-metal capacitor 400 formed in a damascene process, according to an embodiment of the present invention. FIG. 4B shows the same structure from a top view. The vertical serpentine capacitor 400 is formed within a substrate of inter-metal dielectric 104 (e.g. low k dielectric material). A metal region 402 is divided by a vertical serpentine region 406 of high k dielectric material to form the vertical serpentine capacitor 400. The high k dielectric region 406 has two vertical serpentine shaped surfaces opposite one another. The metal region 402 has two sides 402a and 402b each having a surface of substantially vertical serpentine shape proximate to the serpentine dielectric region 406. Electrodes 408a and 408b each connect one side of the copper region 402 to higher layers of the circuit. Not shown are electrodes which connect each half of the copper region 402 to the lower layers of the circuit.

More generally, the metal-insulator-metal capacitor of the present invention may be formed with the high k dielectric barrier having any curvilinear shape with respect to a horizontal cross-section or plane. Consequently, the two metal regions forming the capacitor plates will each have a surface proximate to the high k dielectric which mirrors the curvilinear shape of the high k dielectric. Advantageously, the curvilinear structure of the present invention provides for a capacitor with a large surface area and hence a large capacitance. The present embodiment exposes a relatively small area of copper to a CMP process. Furthermore, a large capacitance per unit horizontal area may be achieved by the curvilinear structure.

Figure 2A:
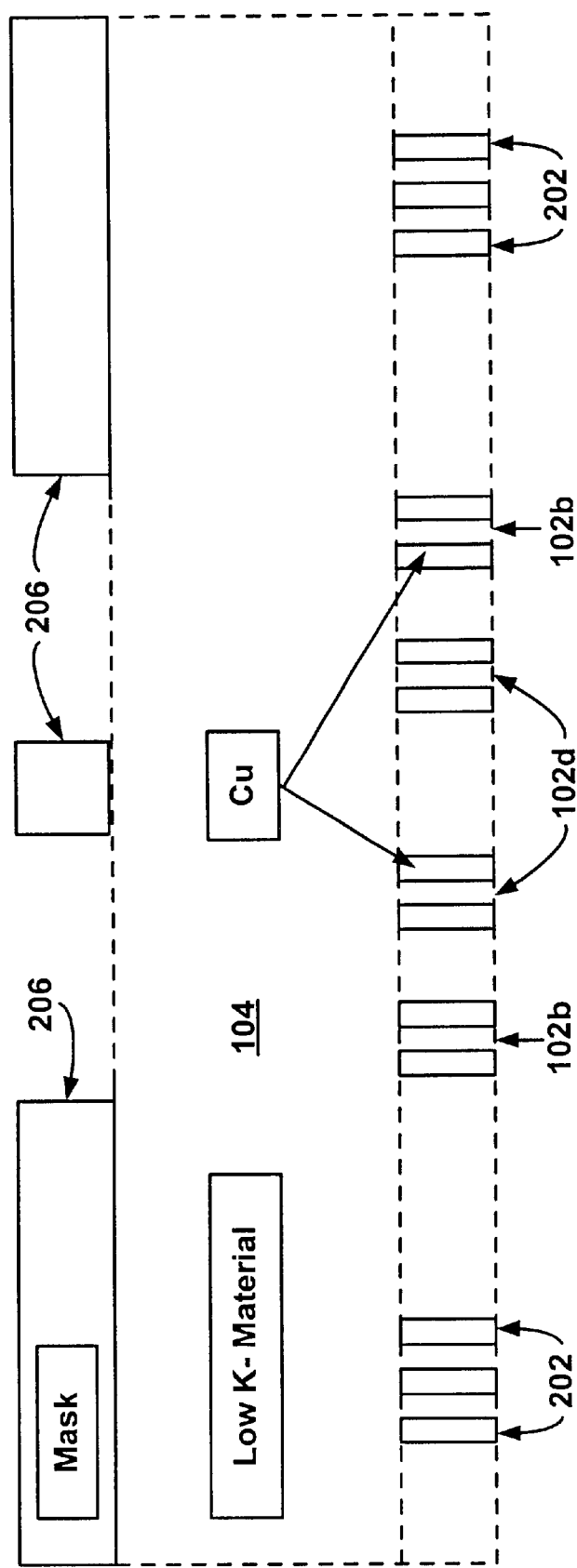
FIGS. 2A–2H are side sectional view of structures illustrating various formation process steps utilized in conjunction with the formation of a novel capacitor in accordance with one embodiment of the present claimed invention.
Figure 2B:
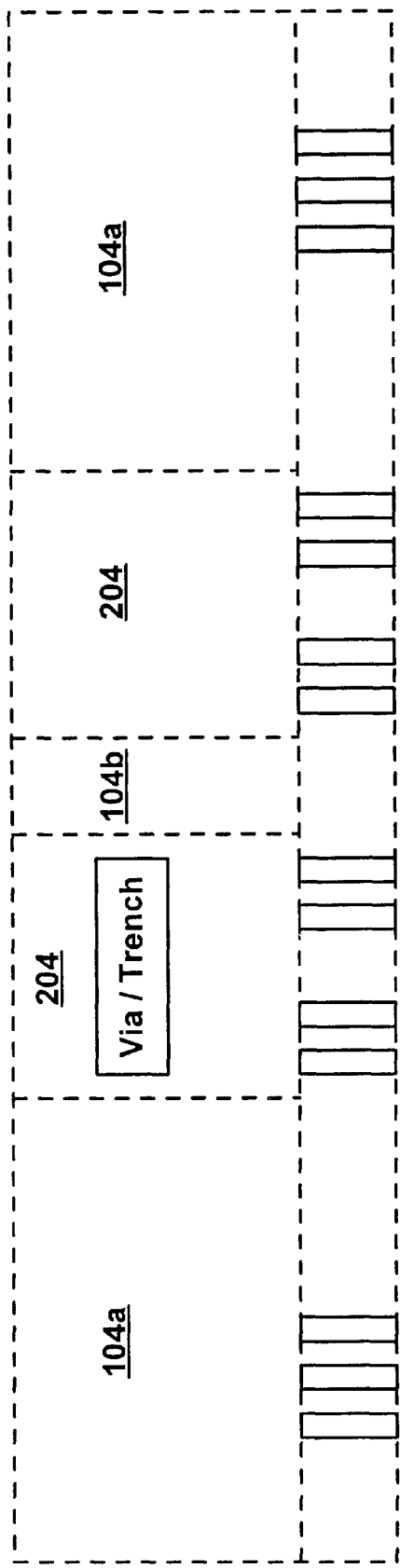
Figure 2C:
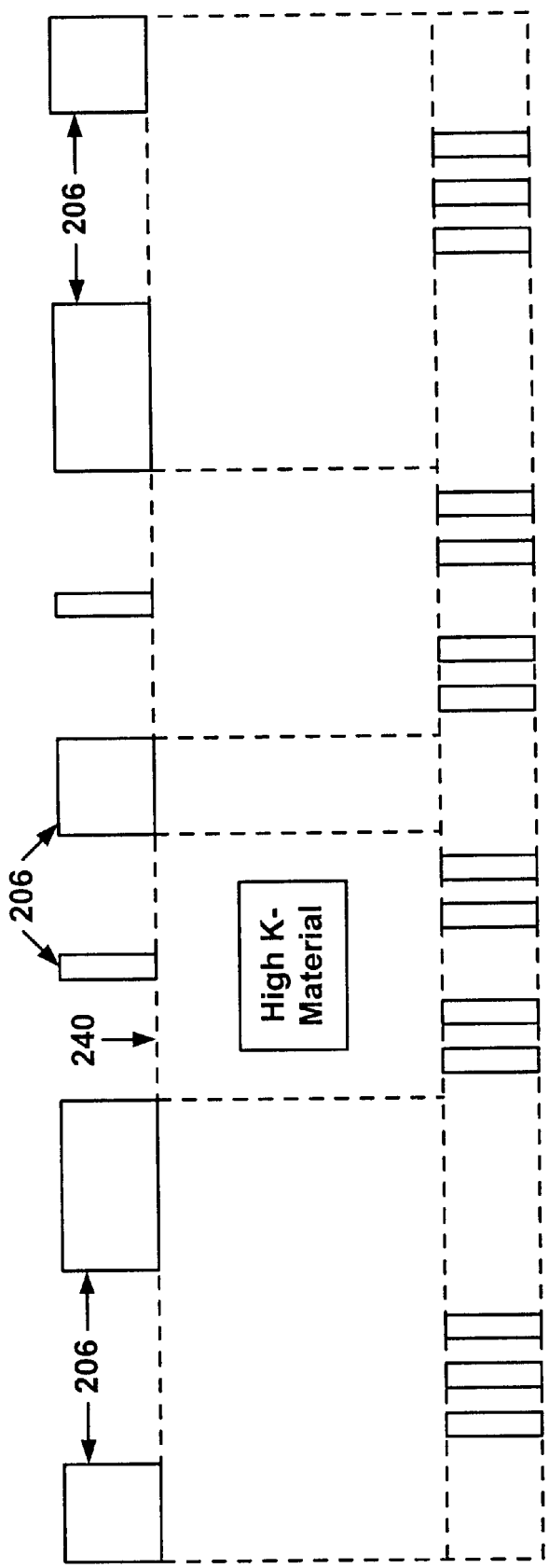
Figure 2D:
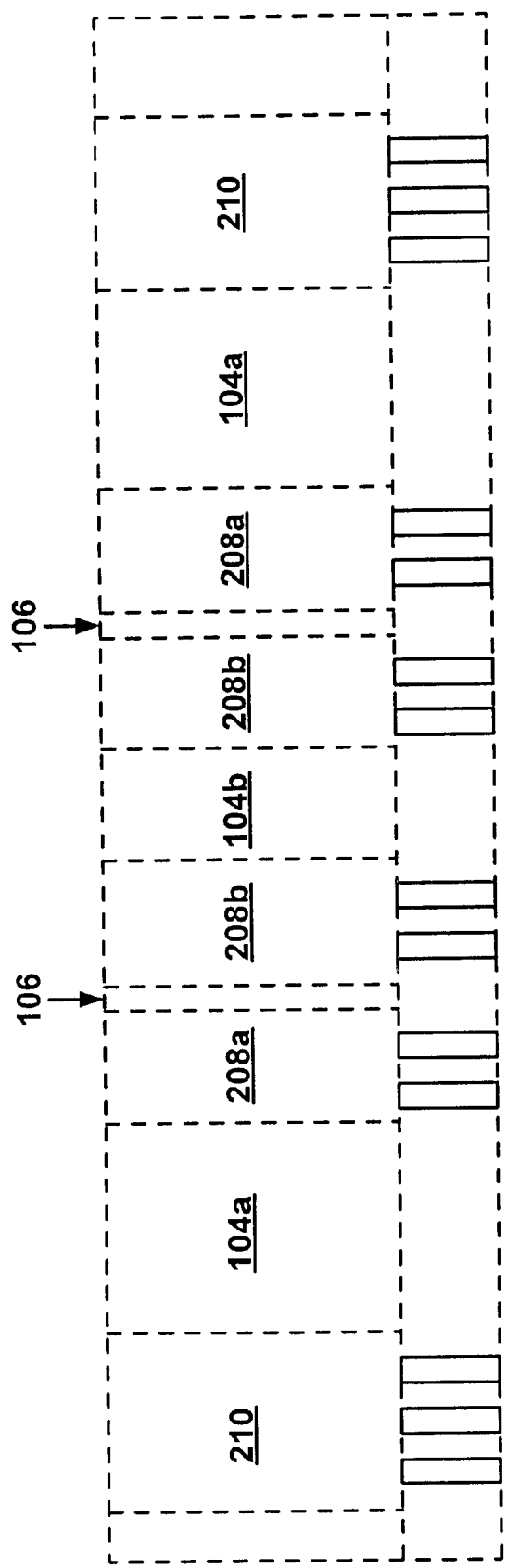
Figure 2E:
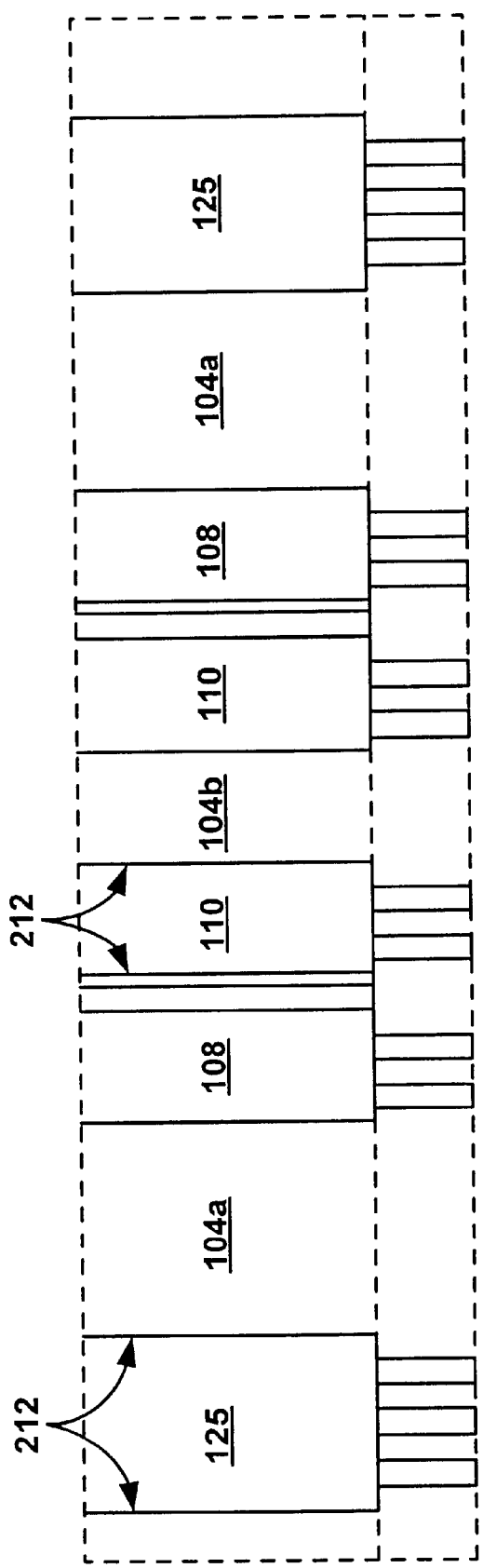
Figure 2F:
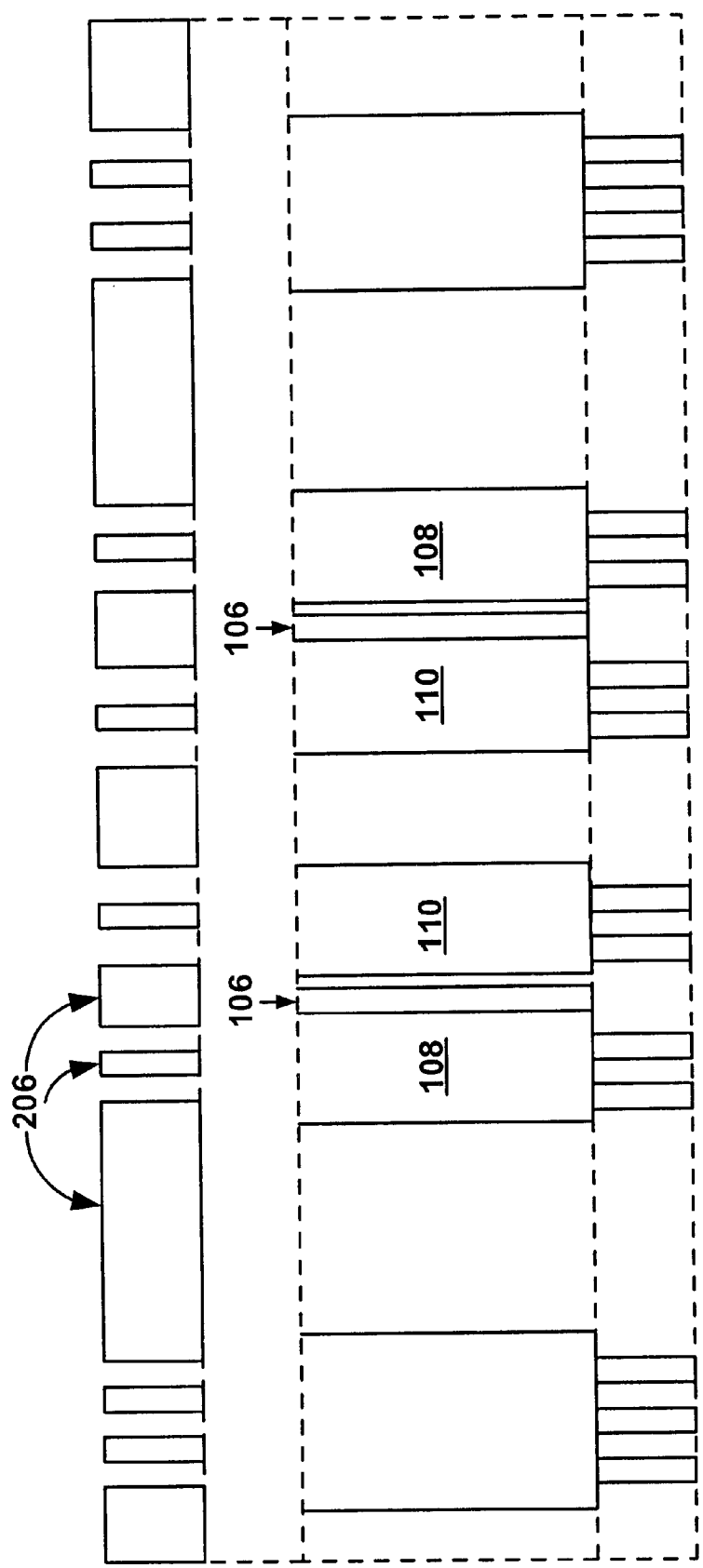
Figure 2G:
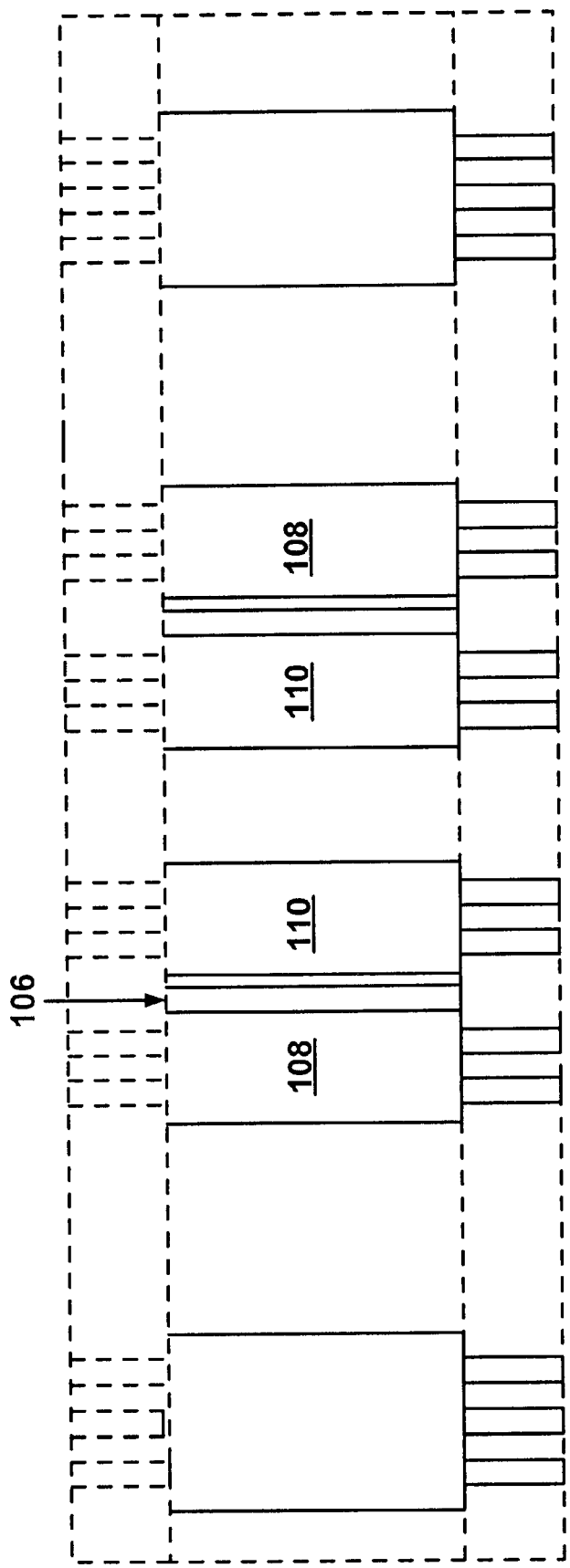
Figure 2H:
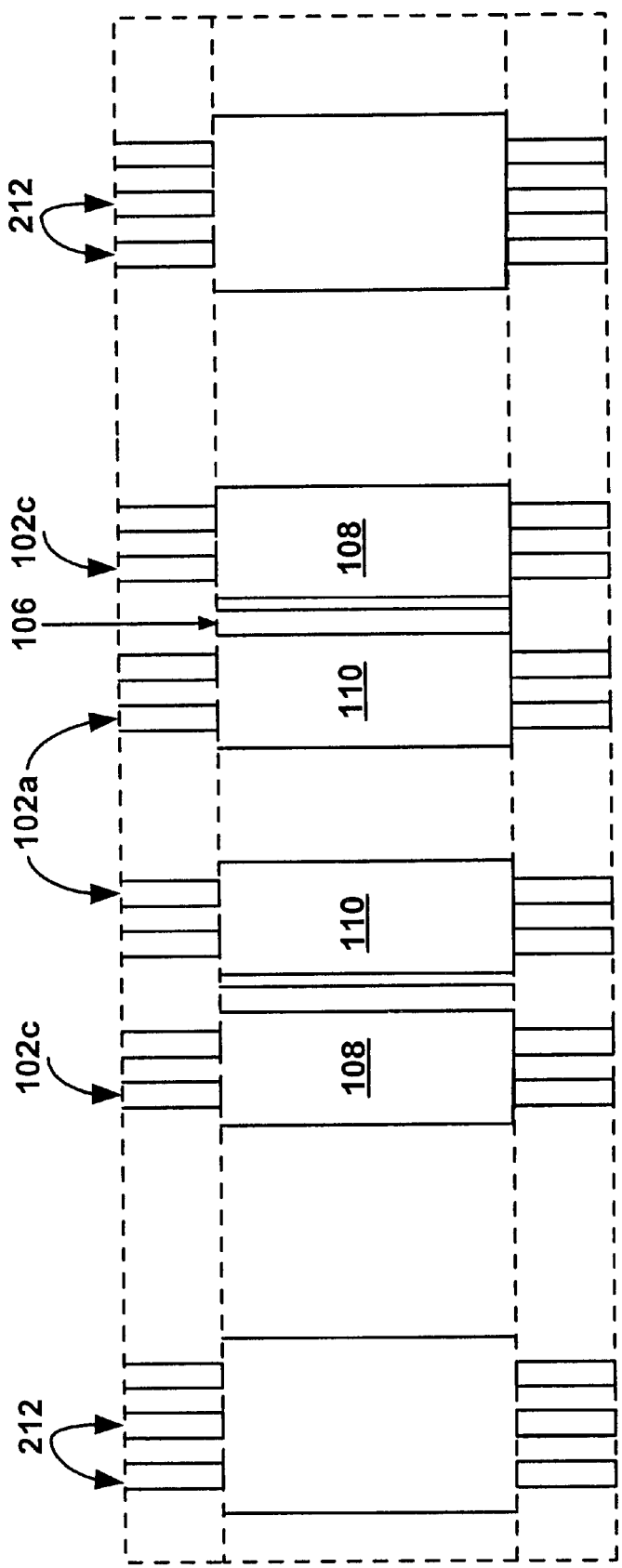
Figure 3:
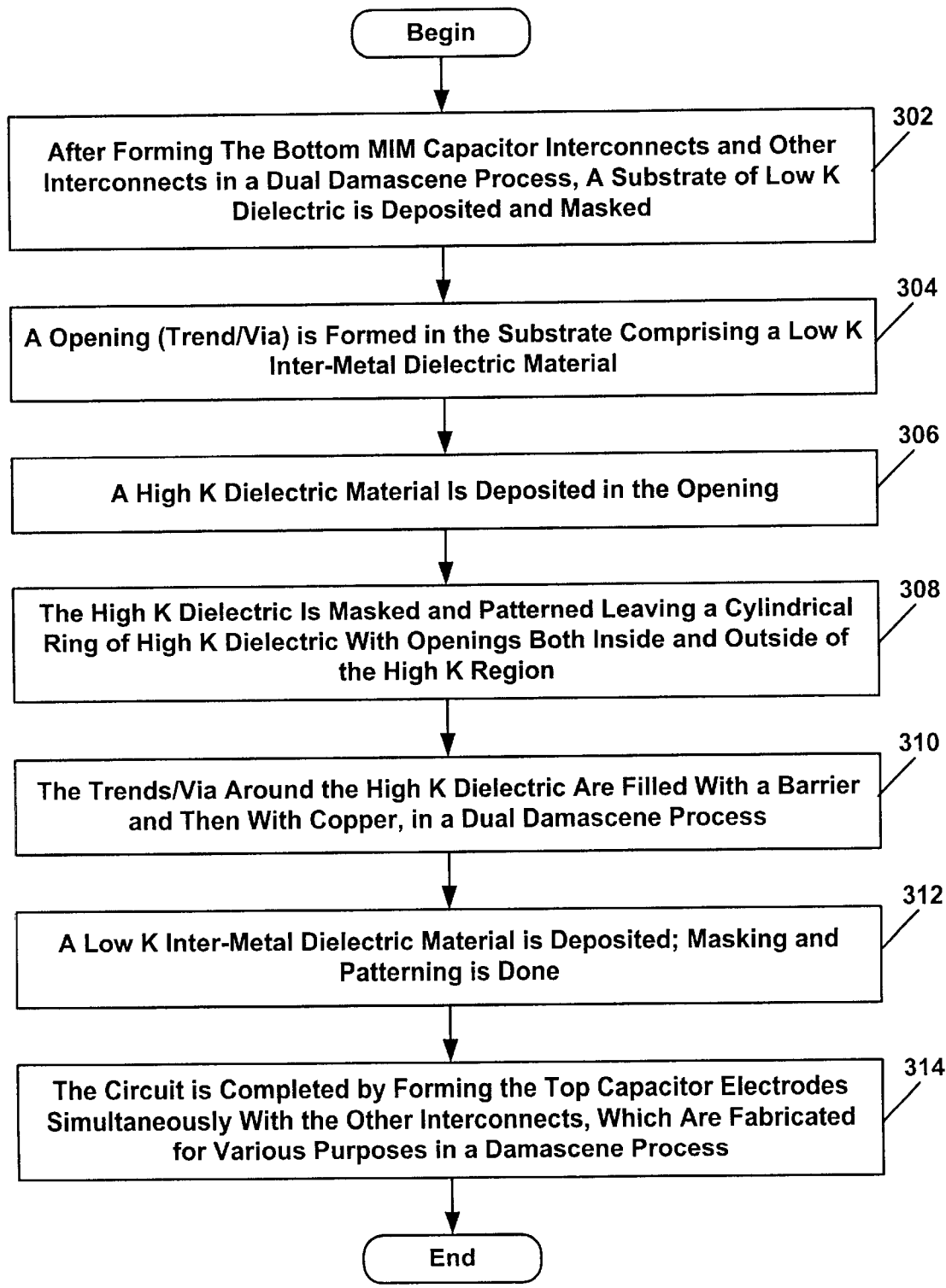
FIG. 3 is a flow chart of steps performed in accordance with one embodiment of the present claimed invention.

FIGS. 2A–2H provide side sectional views of structures created according to embodiments of the method of the present invention as set forth in the flow chart of FIG. 3. For purposes of clarity, the following discussion will utilize the side sectional views of FIGS. 2A–2H in conjunction with the flow chart of FIG. 3 to clearly describe the embodiments of the present invention. While FIGS. 2A–2H depict the formation of a capacitor with a vertical cylindrical shape, the present invention is well suited to forming capacitors with other curvilinear shapes. As will be described in detail below, the method and apparatus of the present invention deal with a novel metal-insulator-metal (MIM) copper capacitor. Furthermore, although the following discussion and examples specifically describe a novel copper MIM capacitor and formation method thereof, the present invention is also well suited to use with metals other than copper, for example, aluminum, etc. Furthermore, the present invention is well suited to forming a metal-oxide-metal (MOM) capacitor.

With reference now to FIG. 2A and to step 302 of FIG. 3, in the present embodiment, after forming the bottom capacitor interconnects 102b and 102d, along with other interconnects 202 in a dual damascene process, a substrate 104 of low k material is deposited and masked 206, as shown in FIG. 2A. The substrate 104 is comprised of a material such as, for example, an inter-metal dielectric (IMD) material. In one embodiment, the IMD is comprised of a material such as, for example, silicon dioxide. Although such an IMD material is recited in the present embodiment, the present embodiment is well suited to the use of any other material into which it is desired to form the present novel MIM capacitor. More importantly, steps of the method embodiments of the present invention occur within a damascene process flow. That is, the present novel copper capacitor is formed during, and using fabrication methods which are compatible with, a damascene, dual-damascene, or multi-damascene process flow. The present invention is not, however, limited solely to use with such damascene process flows.

With reference now to FIG. 2B and to step 304 of FIG. 3, the present embodiment forms a cylindrical opening 204 in the substrate 104 during a damascene process, leaving a cylinder of substrate material remaining inside 104b. More generally, the opening 204 need not be cylindrical. For example, the outer edge of the opening may have other shapes and still allow for the formation of a capacitor with a cylindrical shape with respect to the metal-insulator-metal barrier, as will be seen. In a similar fashion, it is not required that the inner surface of the opening 104 be cylindrical.

With reference now to FIG. 2C and to step 306 of FIG. 3, the present embodiment deposits a high k dielectric material 240 within the cylindrical opening 204. The present method deposits a layer of high k dielectric material 240 such as, for example, silicon nitride, tantalum oxide, or tantalum nitride in the trench/via 204. Alternatively, the high k dielectric material may be a suitable organic material. This high k dielectric region 240 need not have a cylindrical shape. Furthermore, in the present embodiment, the deposition of the high k dielectric material 240 is accomplished during, or in a similar manner to, the deposition of dielectric material for various other purposes during a damascene process.

Referring to FIGS. 2C and 2D, as well as step 308 of FIG. 3, the present embodiment then subjects the structure of FIG. 2C to an etching process to remove certain portions of high k dielectric material 240. In this step of the present embodiment, a layer of photosensitive material (e.g. photoresist 206) is deposited and patterned. For example, the mask 206 over the high k dielectric region 240 may have an annular shape. In this fashion, a high k dielectric layer 106 with a cylindrical shape for the vertical cylindrical MIM. capacitor 100 is formed. In one embodiment of the present invention, the removal of the high k dielectric 240 is performed using a reactive ion etching (RIE) process. The present invention is not, however, limited to the use of such an etching process to remove portions of high k dielectric material 240. Other trenches/vias 210 may also be etched during this step.

Still referring to FIG. 2D, the cylindrical high k dielectric region 106 may be typically be approximately 500 Angstroms wide. However, other widths such as, for example, 100 Angstroms to several thousand Angstroms, may be used depending on the capacitance desired. Furthermore, in the present embodiment, the creation of the cylindrical high k dielectric region 106 is compatible with narrow width masking techniques, such as, for example, 157 nm lithography and step-and-flash imprint lithography. It will be understood that variations of the above steps may be used to form the high k dielectric region 106.

Referring now to FIG. 2E and step 310 of FIG. 3, in a damascene process, a liner material 212 (e.g. tantalum, tantalum nitride, titanium nitride, or the like) is used to prevent subsequently deposited metal (such as copper) from contaminating substrate 104. In the present embodiment, layer 212 is comprised of approximately 50–200 Angstroms of liner material. However, the present invention is well suited to other thicknesses. Then the openings 208 are filled with metal. The present invention is well suited to blanket deposition, electrodeless, or electrolyte processes. In one embodiment, the barrier layer 212 is covered with a top layer, of approximately a few hundred Angstroms, of seed material (i.e. a layer of the material to be subsequently electroplated into openings 208). In so doing, the inner vertical cylindrical metal region 110 is formed with its cylindrical inner surface proximate the outer surface of the high k dielectric region 106 during the damascene process. Furthermore, the outer vertical cylindrical metal region 108 is formed with its cylindrical outer surface proximate the inner surface of the high k dielectric region 106 during the damascene process. In this fashion, a vertical cylindrical MIM capacitor 100 is formed. Furthermore, in the present embodiment, the formation of inner and outer cylindrical metal regions 110 and 108 is accomplished during, or in a similar manner to, the formation of various other metal structures (e.g. metal regions 125) fabricated for various other purposes during a damascene/dual damascene/multi-damascene process. Additionally, a portion of the substrate 104b may be formed into a cylinder inside of the capacitor 100. The inner cylindrical metal region 110 is formed with its inner surface proximate the substrate 104. As is well understood by those of ordinary skill in the art, the present embodiment removes excess metal using, for example, a planarization method such as chemical mechanical polishing (CMP).

With reference now to step 312 of FIG. 3 and FIG. 2F, the present embodiment deposits a second low k IMD layer. The layer may be deposited by, for example, Fluorine Spin-on-Glass (FSG), Spin-on-Glass (SOG), undoped Spin-on-Glass (USG), etc. Then, the present embodiment masks and patterns for the capacitor electrodes 102a and 102c simultaneously with the other interconnects.

With reference now to step 314 of FIG. 3, and FIGS. 2G–2H, the circuit in completed by forming the capacitor electrodes 102a and 102c and other interconnects 212, as per conventional dual damascene MIM or MOM processing.

Figure 5:
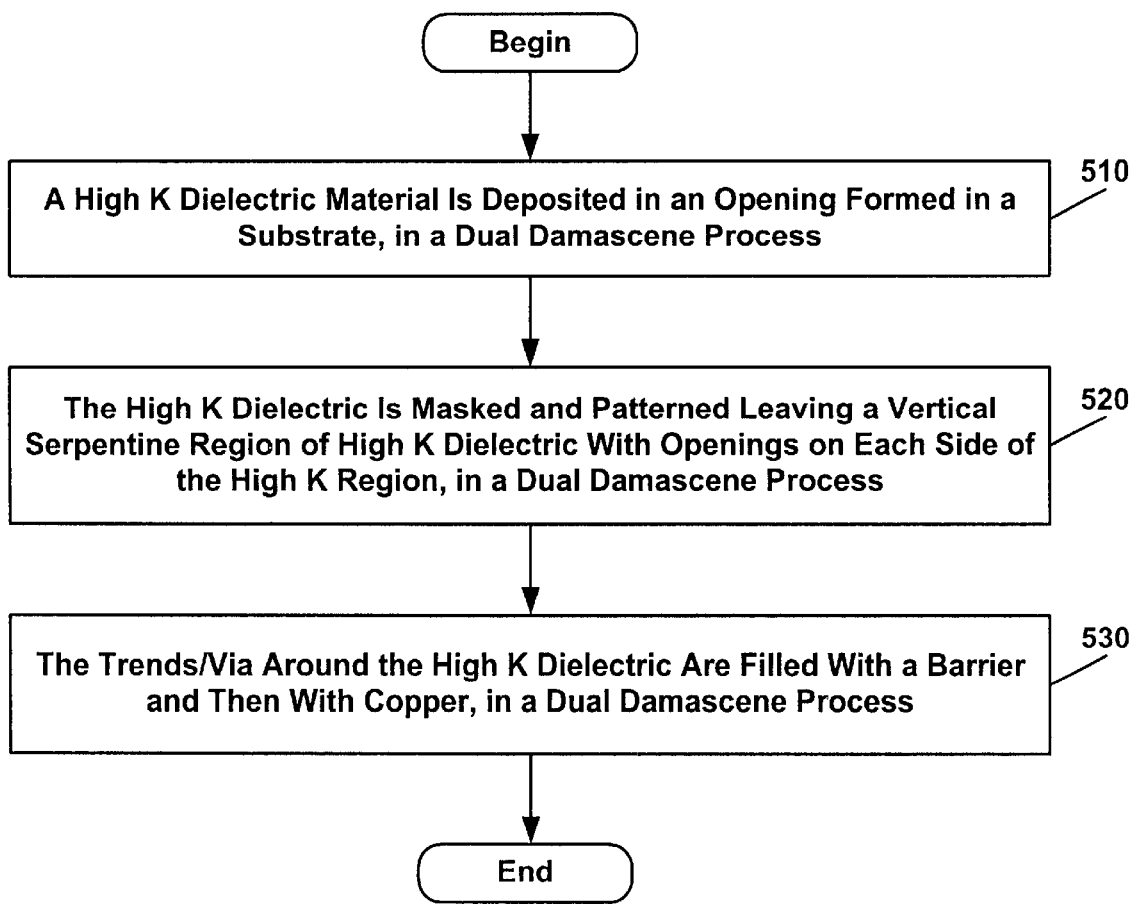
FIG. 5 is a flow chart of steps of forming a vertical serpentine capacitor, in accordance with one embodiment of the present claimed invention.
Figure 6A:
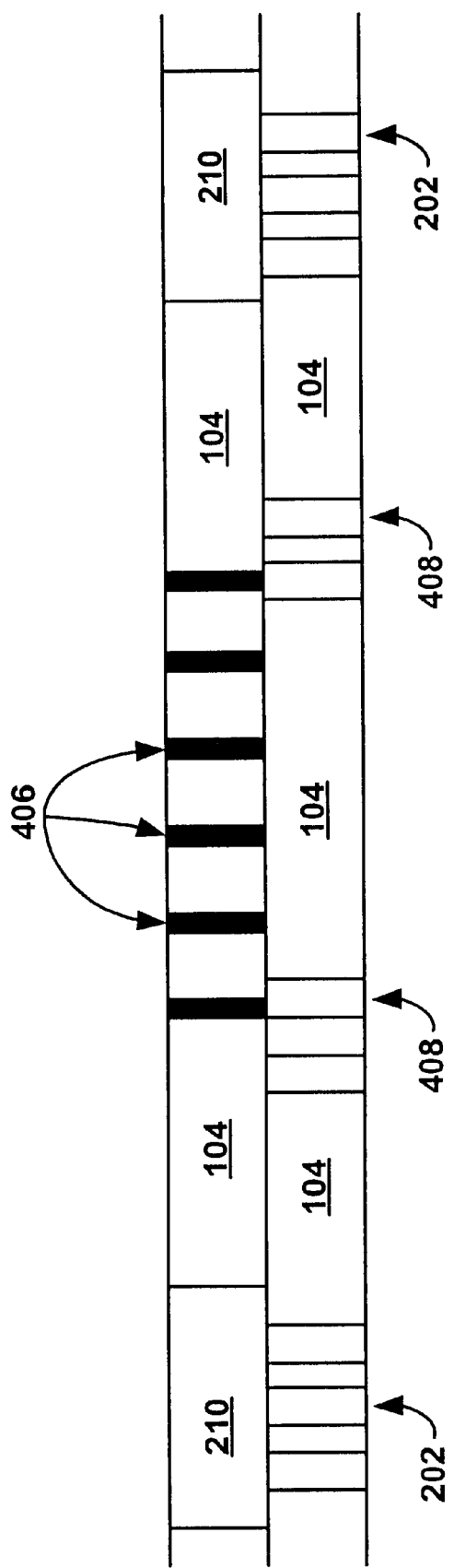
FIG. 6A is a top sectional view of a structure illustrating a step in the formation process utilized in conjunction with the formation of a novel vertical serpentine capacitor in accordance with one embodiment of the present claimed invention.
Figure 6B:
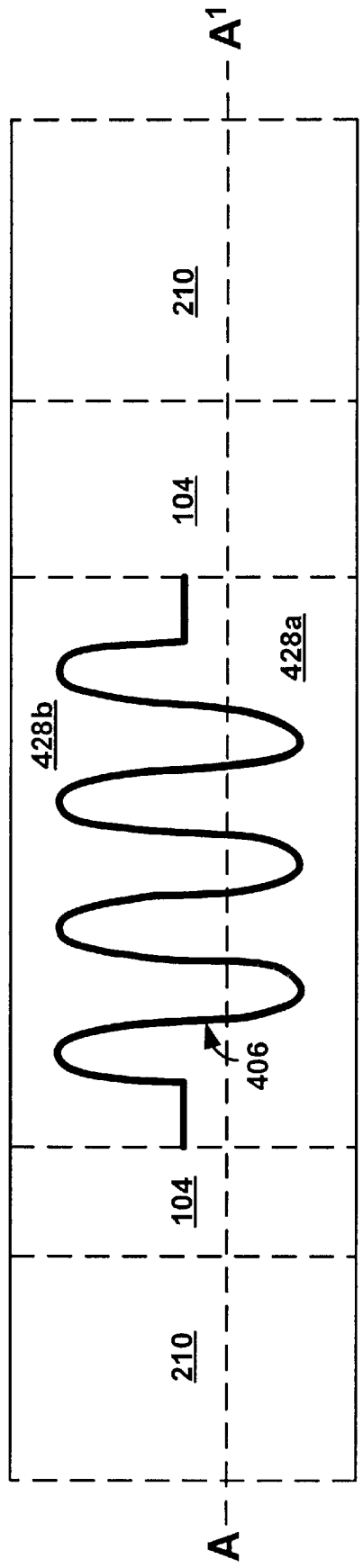
FIG. 6B is a side sectional view of the structure of FIG. 6A in accordance with one embodiment of the present claimed invention.
Figure 6C:
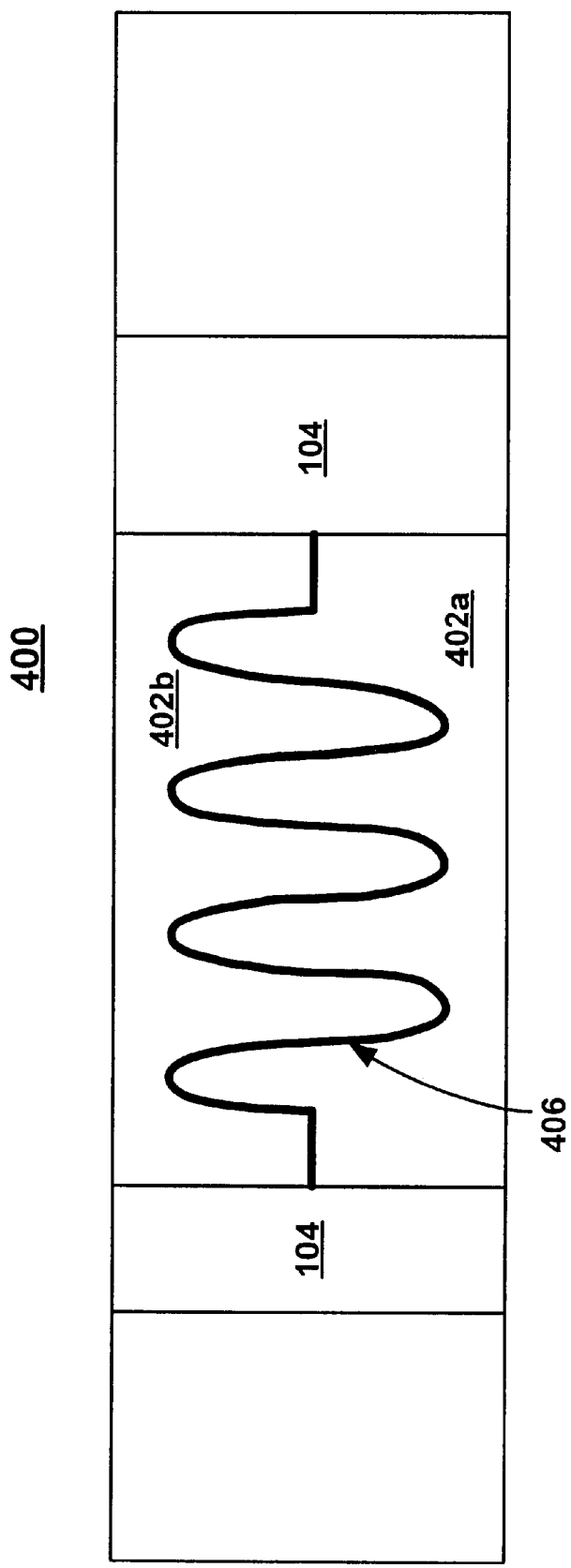
FIG. 6C is a top sectional view of a structure illustrating a step in the formation process utilized in conjunction with the formation of a novel vertical serpentine capacitor in accordance with one embodiment of the present claimed invention.
Figure 6D:
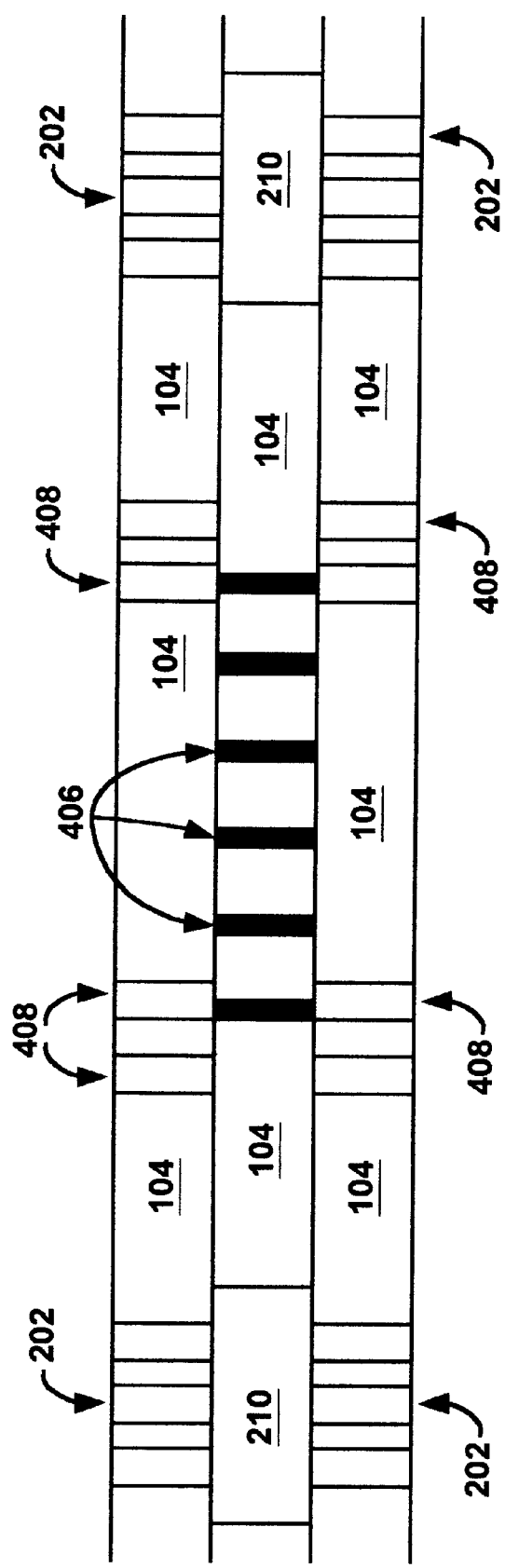
FIG. 6D is a side sectional view of a structure illustrating a step in the formation process utilized in conjunction with the formation of a novel vertical serpentine capacitor in accordance with one embodiment or the present claimed invention.

As described herein, the method described in FIG. 3 may be modified to form capacitors with other curvilinear shapes with respect to the metal-insulator-metal barrier. FIG. 5 describes the steps of a process which may be substituted for steps of the process of FIG. 3. FIG. 6A shows a side sectional view and FIGS. 6B–6C illustrate top sectional views of capacitor formation. In step 510 of FIG. 5, the present embodiment deposits a high k dielectric material within an opening in the substrate. The opening need not have a shape analogous to the curvilinear shape which the capacitor 400 will have. The present method deposits a layer of high k dielectric material 240 such as, for example, silicon nitride, tantalum oxide, or the like. Furthermore, in the present embodiment, the deposition of the high k dielectric material 240 is accomplished during, or in a similar manner to, the deposition of high k dielectric material for various other purposes during a damascene process.

Referring to step 520 of FIG. 5 and FIGS. 6A–6B, the present embodiment then performs an etching process to remove certain portions of high k dielectric material 240. In this step of the present embodiment, a layer of photosensitive material (e.g. photoresist 206) is deposited and patterned. For example, the mask 206 over the high k dielectric region 240 may have a serpentine shape. In this fashion, a high k dielectric layer 406 with a vertical serpentine shape for the vertical serpentine MIM capacitor 100 is formed, as seen in FIGS. 6A and 6B. In one embodiment of the present invention, the removal of the high k dielectric 240 is performed using a reactive ion etching (RIE) process. The present invention is not, however, limited to the use of such an etching process to remove portions of high k dielectric material 240. Other trenches/vias 210 may also be etched during this step.

The serpentine high k dielectric region 406 may typically be approximately 500 Angstroms wide. However, other widths such as, for example, 100 Angstroms to several thousand Angstroms, may be used depending on the capacitance desired. Furthermore, in the present embodiment, the creation of the serpentine high. k dielectric region 406 is compatible with narrow width masking techniques, such as, for example, 157 nm lithography and step-and-flash imprint lithography.

Referring now to step 530 of FIG. 5 and to FIG. 6C, in a damascene process, a liner material 212 (e.g. tantalum, tantalum nitride, titanium nitride, or the like) is used to prevent subsequently deposited metal (such as copper) from contaminating substrate 104. In the present embodiment, layer 212 is comprised of approximately 50–200 Angstroms of liner material. However, the present invention is well suited to other thicknesses. Then the openings 428a, 428b are filled with metal. The present invention is well suited to blanket deposition, electrodeless, or electrolyte processes. In one embodiment, the barrier layer 212 is covered with a top layer, of approximately a few hundred Angstroms, of seed material (i.e. a layer of the material to be subsequently electroplated into openings 208). In so doing, the metal regions 402 with vertical serpentine surfaces are formed around the vertical serpentine high k dielectric barrier 406 such that a vertical serpentine MIM capacitor 400 is formed. Furthermore, in the present embodiment, the formation of metal regions 402 with a serpentine side surface 408a and 408b are accomplished during, or in a similar manner to, the formation of various other metal structures fabricated for various other purposes during a damascene, dual damascene, or multi-damascene process.

Beneficially, the structures and formation methods of the present embodiments are realized using existing semiconductor fabrication processes such that significant revamping of semiconductor capital equipment is not required. As a result, the present embodiments do not require significant costs to implement.

Thus, the present invention provides a capacitor and a method for forming the capacitor wherein the capacitor and the formation method are compatible with newer semiconductor fabrication techniques. The present embodiment further provides a capacitor and a method for forming the capacitor wherein the capacitor and the formation method achieve the above-listed accomplishment and are compatible with existing semiconductor fabrication processes such that significant revamping of semiconductor capital equipment is not required. The present invention further provides a capacitor formed in a damascene process with copper that may be substantially larger than 100 square micrometers. The present invention further provides a capacitor and a method for forming a capacitor with a high capacitance per unit area.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the Claims appended hereto and their equivalents.

We claim:

1. A method for forming a metal-insulator-metal MIM capacitor during a damascene process, said method comprising the steps of:
    a) forming a dielectric region having a first and a second curvilinear surface during said damascene process, said surface being curvilinear with respect to horizontal cross-section;
    b) forming a first metal region having a curvilinear surface during said damascene process; and
    c) forming a second metal region having a curvilinear surface during said damascene process, with said dielectric region is disposed between said first metal region and said second metal region such that said MIM capacitor is formed.

2. The method for forming a MIM capacitor as recited in claim 1, wherein said first and said second curvilinear surfaces of said dielectric, said curvilinear surface of said first metal region, and said curvilinear surface of said second metal region are substantially cylindrical.

3. The method for forming a MIM capacitor as recited in claim 1, wherein said first and said second curvilinear surfaces of said dielectric, said curvilinear surface of said first metal region, and said curvilinear surface of said second metal region are substantially vertical serpentine.

4. The method for forming a MIM capacitor as recited in claim 1, wherein:
    step a) comprises:
        a1) forming an opening in a substrate during said damascene process; and
        a2) forming said dielectric region at least partially within said opening during said damascene process;
    step b) comprises forming said first metal region with its said curvilinear surface proximate said first surface of said dielectric region during said damascene process; and
    step c) comprises forming said second metal region with its said surface proximate said second surface of said dielectric region during said damascene process.

5. The method for forming a MIM capacitor as recited in claim 4 wherein:
    step a1) comprises forming said opening with a portion of said substrate remaining substantially in the center of said opening, said substrate comprising an inter-metal dielectric; and
    step c) comprises forming said second metal region with a second surface proximate said remaining substrate.

6. The method for forming a MIM capacitor as recited in claim 1 wherein step b) comprises forming said first metal region of copper.

7. The method for forming a MIM capacitor as recited in claim 1 wherein step c) comprises forming said second metal region of copper.

* * * * *